United States Patent [19]
Cassinelli

[11] Patent Number: 4,860,165
[45] Date of Patent: Aug. 22, 1989

[54] SEMICONDUCTOR CHIP CARRIER PACKAGE

[75] Inventor: Edgar Cassinelli, Marlboro, Mass.

[73] Assignee: Prime Computer, Inc., Natick, Mass.

[21] Appl. No.: 187,057

[22] Filed: Apr. 27, 1988

[51] Int. Cl.$^4$ .............................................. H05K 7/20
[52] U.S. Cl. .................................. 361/388; 361/414; 165/80.4; 357/81
[58] Field of Search ..................... 174/16.3; 165/80.3, 165/80.4; 357/74, 81, 82; 361/385–388, 401, 410, 412–414

[56] References Cited

U.S. PATENT DOCUMENTS

| | | | |
|---|---|---|---|
| 4,245,273 | 1/1981 | Feinberg | 361/385 |
| 4,509,096 | 4/1985 | Baldwin | 361/386 |
| 4,521,828 | 6/1985 | Fanning | 361/386 |
| 4,563,725 | 1/1986 | Kirby | 361/386 |
| 4,628,407 | 12/1986 | August | 361/386 |
| 4,630,172 | 12/1986 | Stenerson | 361/386 |
| 4,652,970 | 3/1987 | Watari | 361/385 |
| 4,731,701 | 3/1988 | Kuo | 361/388 |
| 4,744,008 | 5/1988 | Black | 361/386 |
| 4,765,400 | 8/1988 | Chu | 361/385 |

Primary Examiner—Gerald P. Tolin
Attorney, Agent, or Firm—Wolf, Greenfield & Sacks

[57] ABSTRACT

A semiconductor chip carrier package formed of a multi-layer circuit board having mounted therein a semiconductor chip support pad. The multi-layer circuit board is comprised of separate dielectric boards defining multiple conductive run layers including a signal layer and a plurality of power layers. A pluralilty of pins supported from the circuit board extending from one side thereof and including signal pins and power pins. The power pins are disposed peripherally outside of the signal pins. Means are provided for conductively connecting leads of the semiconductor chip to corresponding conductive runs of the signal and power layers.

13 Claims, 5 Drawing Sheets

SEMICONDUCTOR CHIP CARRIER PACKAGE

BACKGROUND OF THE INVENTION

1. Field of the Invention

The present invention relates in general to a semiconductor chip carrier package. More particularly, the invention pertains to a carrier package for support of a VLSI semiconductor chip to enable mounting to a substrate such as a printed circuit board.

2. Background Discussion

Typical ECL VLSI carrier package designs are constructed of a ceramic material or printed circuit board material in a pin-grid array configuration. With existing package designs difficulty has been encountered in controlling such parameters as inductance and heat dissapation with these packages, particularly in connection with high speed ECL circuitry.

Accordingly, it is an object of the present invention to provide an improved semiconductor chip carrier package that is characterized by improved electrical performance.

Another object of the present invention is to provide an improved semiconductor chip carrier package that is characterized by a reduction in pin count.

Still another object of the present invention is to provide an improved semiconductor chip carrier package that is provided with an integral heat sink and thermal button for semiconductor chip carrier support and heat sinking.

A further object of the present invention is to provide an improved semiconductor chip carrier package that has a design that minimizes signal lengths and enables placement of the power pins at the periphery, outside of the signal pins.

SUMMARY OF THE INVENTION

To accomplish the foregoing and other objects, features and advantages of the invention there is provided a semiconductor chip carrier package that is comprised of a multi-layer circuit board means having an outer peripheral portion and an inner opening. This inner opening is typically square although it may be of other configuration and is adapted to receive a semiconductor chip support means (chip pad) disposed at the inner opening and for supporting the semiconductor chip. The multi-layer circuit board means is comprised of separate electric boards, each having defined thereon conductive runs, identified herein as multiple conductive run layers, including a signal layer and at least one power layer. A plurality of pins supported from the outer peripheral portion of the multi-layer circuit board extend from one side thereof. The plurality of pins include signal pins coupling to the signal layer and power pins coupling to the power layer. The power pins are disposed peripherally outside of the signal pins. Means are provided for conductively connecting leads of the semiconductor chip to corresponding conductive run of the signal and power layers.

In accordance with further features of the invention the semiconductor chip support means is comprised of a heat sink and a chip support end (pad). The heat sink and chip support ends are integrally formed of a heat conductive material such as a metal. The circuit board inner opening is dimensioned to engagingly receive the chip support end with the heat sink end being larger in cross dimension than that of the chip support end so as to overlay a part of the outer peripheral portion of the circuit board. The heat sink preferably has a thermal transfer surface and a peripheral cantilever section. The pins extend from the circuit board in a direction opposite to that of the heat sink. Decoupling capacitors are supported on the other side of the circuit board and include means for connecting the capacitors to predetermined pins. The decoupling capacitors are disposed at the outer edge of the outer peripheral portion of the circuit board adjacent to the heat sink.

In accordance with a further feature of the present invention the power layers are defined in multiple layers corresponding in number to the number of different voltage requirements of the semiconductor chip. The aforementioned means for conductively connecting leads of the chip to the conductive layers includes connecting tabs preferably disposed on the signal layer and to which the chip leads are secured. Also provide are conductive vias that intercouple between the dielectric boards and that are used for connecting the power layers to selected one of the power connecting tabs.

In accordance with an alternative embodiment of the present invention the heat sink is a liquid-cooled heat sink and thus is defined by a chamber having a cooling liquid flowing through the chamber for cooling liquid flowing through the chamber for cooling of the semiconductor chip.

In another embodiment of the present invention the multilayer circuit board has multiple openings each for support of the semiconductor chip support means for support of a plurality of semiconductor chips in an array. In this embodiment the heat sink structure may be common to all chip support means.

BRIEF DESCRIPTION OF THE DRAWINGS

Numerous other objects, features and advantages of the present invention should now become apparent upon a reading of the following detailed description taken in conjunction with the accompanying drawings, in which.

DETAILED DESCRIPTION

The semiconductor chip carrier package of the present invention provides a design of substantially improved performance. The particular package construction controls lead lengths, provides for optimum positioning of ground and power layers, and furthermore provides for an internal heat sink to produce an overall optimum performance package particularly for high speed ECL VLSI circuitry. In accordance with the present invention as will be described in further detail hereinafter, the ground and power pins are disposed about the perimeter of the package with the power wiring traveling through a via to minimize each line length. Also, by providing the power pins along the perimeter of the package, the pins now have enough room to allow a more optimum placement of decoupling capacitors thereby minimizing the delta I noise.

The design of the present invention also is characterized by an integral heat sink and support button for the semiconductor chip. In the past, heat sinks have usually been attached to the support button by epoxy, solder or brazing. The present invention eliminates the need for any attachment means by using a one piece heat sink and support button.

Figure 1:
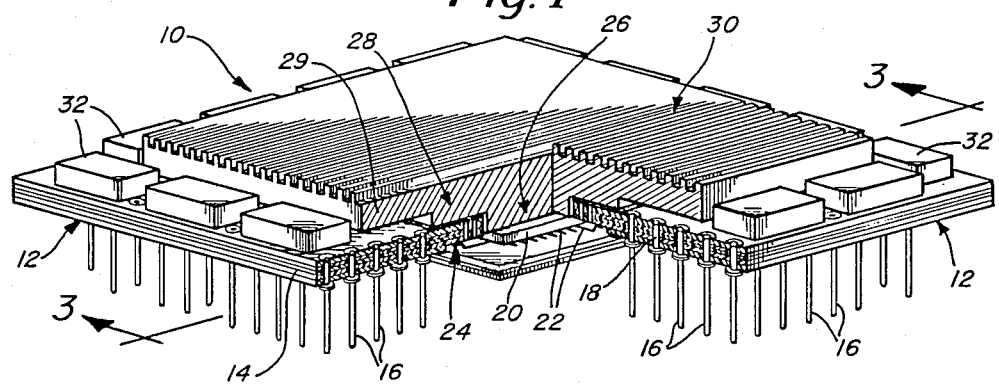
FIG. 1 is a perspective view of the semiconductor chip carrier package of the present invention partially cut away to show further details of the package.
Figure 2:
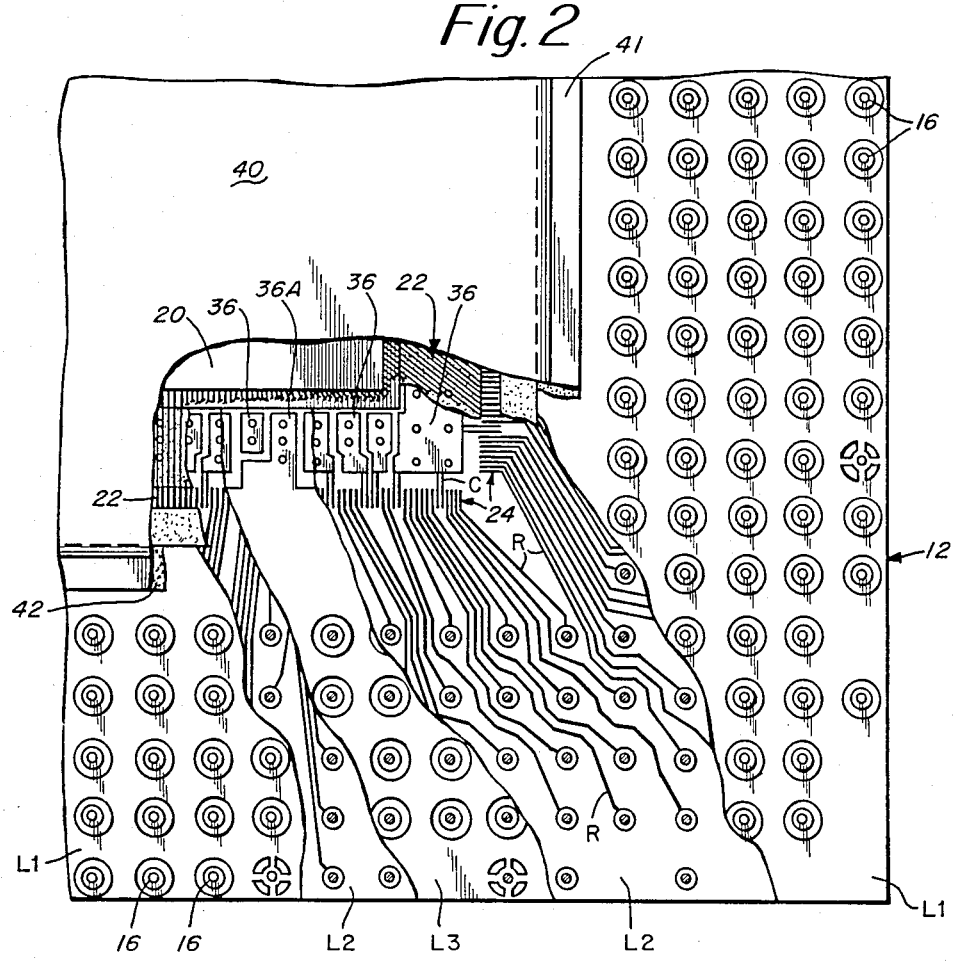
FIG. 2 is a fragmentary bottom view of the semiconductor chip carrier package of FIG. 1 partially broken away to illustrate the different layers of the circuit board.
Figure 3:
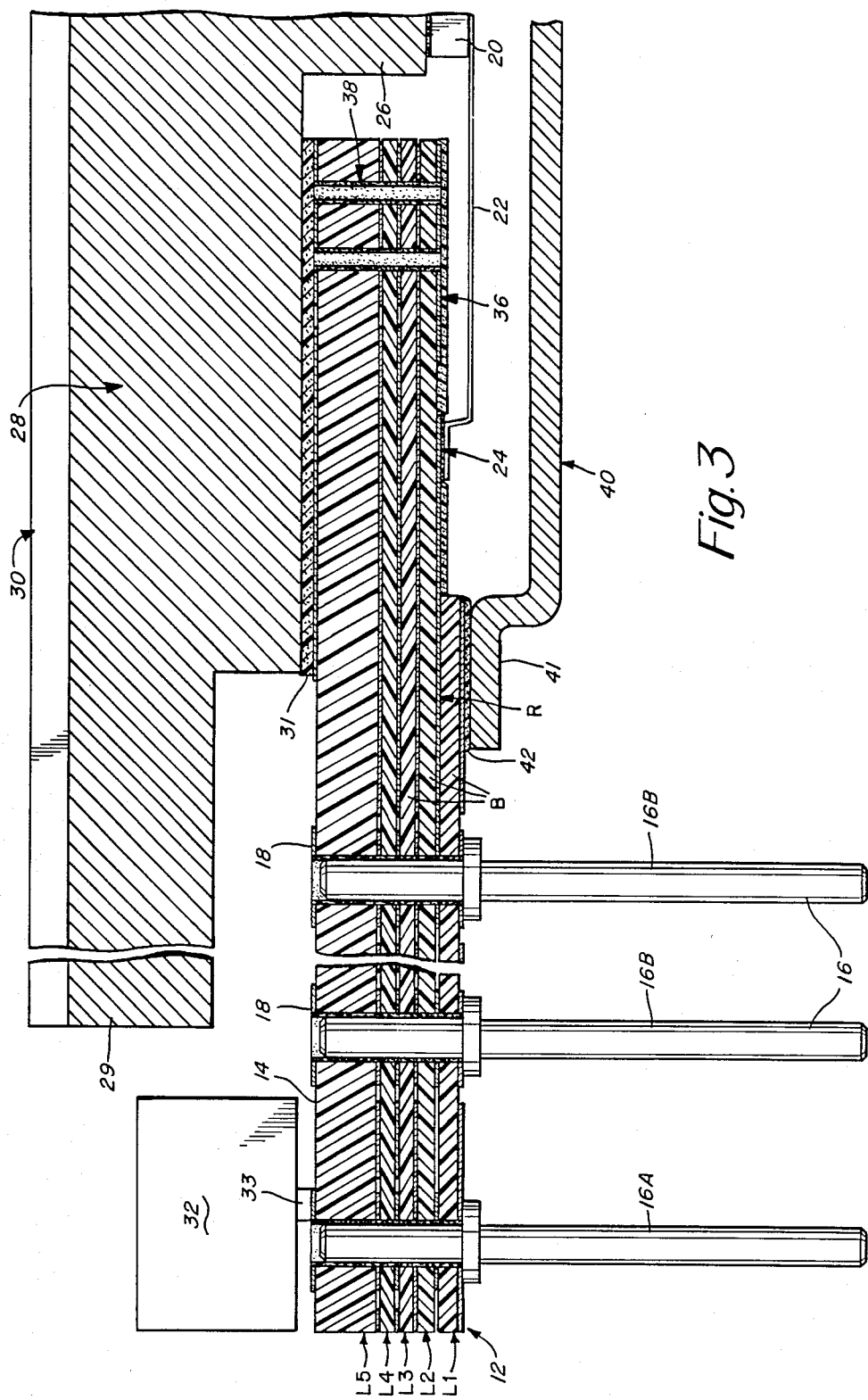
FIG. 3 is an enlarged cross sectional view taken along line 3—3 of FIG. 1 and specifically taken through one of the via pads, and illustrating both power and signal pins.

Reference is now made to the drawings and in particular FIGS. 1-3. There is described a semiconductor chip carrier package that is comprised of a multi-layer circuit board 12 having an outer peripheral portion 14 at which there are supported a plurality of pins 16. The pins, as illustrated in the detail of FIG. 3, are supported in the circuit board 12 in corresponding conductive vias 18. Further details of the circuit board 12 are described hereinafter in connection with FIGS. 2 and 3.

FIG. 1 shows the edge of the semiconductor chip 20 with its associated leads 22 which are adapted to electrically connect to connecting tabs 24 of the signal layer of the circuit board 12. Note the tabs illustrated at 24 in FIGS. 2 and 3. FIG. 1 illustrates the semiconductor chip support means including the support button 26 that is preferably of a metallic material that is a good heat conductor. The button 26 is integral with the heat sink 28. Note in FIG. 1 the heat transfer surface 30 of the heat sink. The circuit board 12 has a centrally disposed square shaped opening for receiving the button 26. The button 26 may be epoxied in the opening. FIG. 3 shows one form of support by means of an epoxy layer 31 for securing the combination heat sink and button to the circuit board. It is also noted that the heat sink 28 includes a cantilever section 29 terminating short of the board edge to leave an area for support of the decoupling capacitors 32. FIG. 1 illustrates the decoupling capacitors 32 disposed about the periphery of the circuit board 12. These decoupling capacitors are connected to assigned pins through a surface mount land pattern as illustrated in FIG. 3.

The multi-layer circuit board 12, as illustrated in, for example, FIG. 3 is comprised of a plurality of separate circuit boards or dielectric boards identified in FIG. 3 as boards B. Each of these circuit boards along with its associated conductive layers or conductive runs may be referred to herein as a layer. These separate layers are identified in FIG. 3 as layers L1-L5. These may also be referred to as planes. The layers L1 and L3 are Vcc planes. The layer L2 is a signal layer. The layer L4 is a Vee plane. The layer L5 is a Vee 2 plane. In FIG. 3 the power pin 16A is illustrated as connected to the Vcc plane, specifically layer L3. The pin 16B in FIG. 3 is a signal pin connecting to the signal layer L2. The aforementioned connecting tabs 24 are all disposed on the signal layer L2.

In this regard also refer to FIG. 2 that shows the tabs 24. It is noted that there are a number of conductive runs R that are disposed as part of the layer L2 that couple from corresponding signal pins to form the tabs 24. It is furthermore noted in FIG. 2 that some of the tabs 24 couple from the power via tabs 36. In this regard refer also to FIG. 3 and the schematic diagram of FIGS. 5 and 6 for an illustration of the circuit paths. Refer also to the conductive vias 38, probably most clearly illustrated in FIG. 3, and adapted to intercouple between the various layers L1-L5. Also refer to FIG. 2 and the illustrated layer L3 showing the conductive coupling to tab 36A. The layer L3 is then conductively coupled by way of the conductive via 38 to a connecting tab 24 of layer L2. The particular lead 22 associated with the circuit chip connects to the appropriate connecting tab 24, as illustrated in FIGS. 2 and 3. Some of the leads 22 connect to signal tabs while others connect to power tabs.

FIGS. 2 and 3 also illustrate the protective lid 40 that is disposed over the semiconductor chip 20. The lid 40 at its periphery 41 is secured to the circuit board. FIG. 3 shows the lid seal at 42.

In the particular embodiment of FIG. 3, the cross section is taken at a position for illustration of direct conductive coupling of signals from the rightmost pin 16B by way of a conductive run R to the tab 24. The lead 22 illustrated in FIG. 3 is a signal lead associated with the semiconductor chip 20. This lead 22 is the one shown coupling to the tab 24. It is futhermore noted that one of the peripheral pins 16A illustrated in FIG. 3 connects to layer L3. This layer in turn connects to the conductive vias 38. However, in the cross section taken in FIG. 3 there is no further coupling because the particular lead shown in FIG. 22 is a signal lead and not a power lead.

Figure 4:
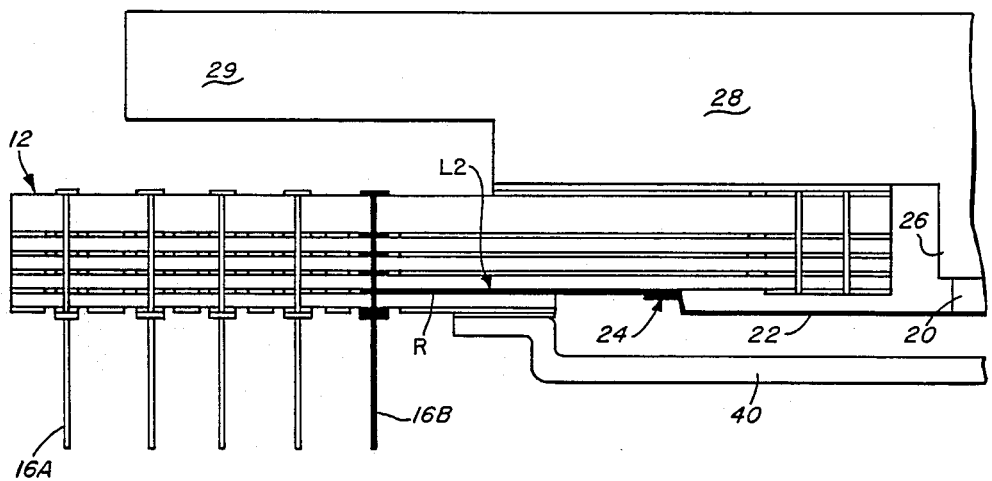
FIG. 4 is a schematic cross sectional view illustrating a signal pin and associated circuit path.
Figure 5:
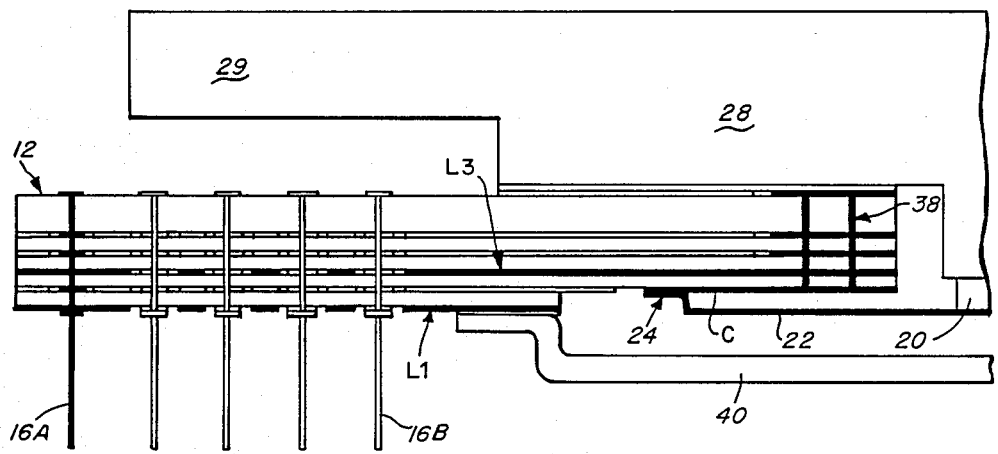
FIG. 5 is a schematic cross sectional view showing a power pin and conductive path to the circuit chip by way of conductive vias.
Figure 6:
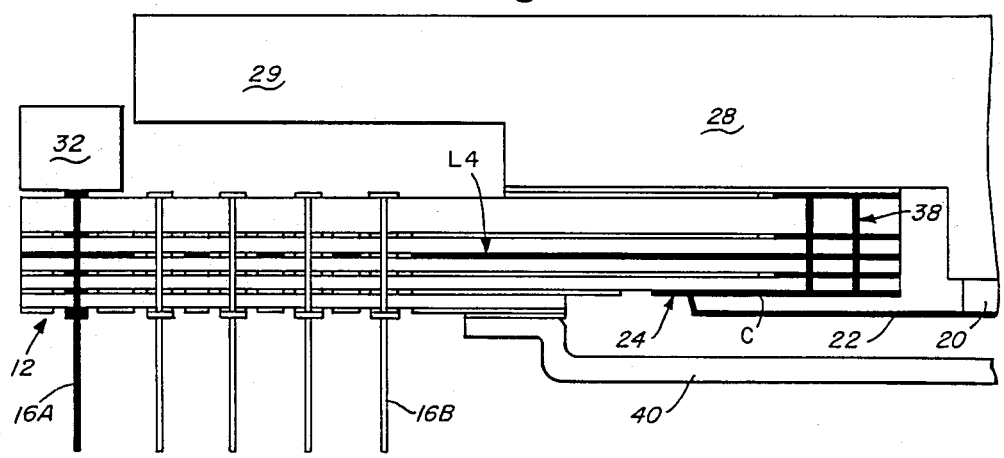
FIG. 6 is a schematic cross sectional view also illustrating a different power layer and the conductive path from a decoupling capacitor through conductive vias to the semiconductor chip.

Reference is now made to the somewhat schematic diagrams of FIGS. 4-6. These diagrams illustrate by solid outline, various conductive paths associated with layers of the circuit board. For example, FIG. 4 illustrates a schematic cross section for illustration of a signal run. In FIG. 4 the pin 16B shown in solid is representative of a signal pin. Actually, in FIG. 4 all of the pins illustrated except the leftmost pin are signal pins. It is noted that in this particular cross sectional view the lead 22 associated with the semiconductor chip 20 is a signal lead and the signal path is from the pin 16B by way of a conductive run R of layer L2 to the connecting tab 24 and from there to the lead 22.

Now FIG. 5 illustrates a further cross section through the Vcc vias 38. The power pin is shown in FIG. 5 at 16A. FIG. 5 also illustrates the reference plane L1 and the Vcc plane L3 to which the pin 16A is in direct electrical contact. The layer L3, it is noted, couples to the vias 38 associated with a particular one of the via pads, such as illustrated in FIG. 2 associated with that particular layer. Note in FIG. 5 there is a conductor C that couples from the vias to the connecting pad 24. This conductor C is also illustrated in FIG.

2 essentially integral with a connecting tab 24. With the arrangement of FIG. 5 it is thus noted that there is a conductive path from the pin 16A by way of layer L3 and the vias to tab 24 and in turn to the lead 22. In FIG. 5 the lead 22 is a Vcc power lead to the semiconductor chip 20.

FIG. 6 is a schematic cross sectional view taken through the Vee plane. The Vee 2 plane would be similar. Thus, in FIG. 6 there is shown the conductive layer L4 coupling to the vias 38 and from there by way of the conductor C to the connecting tab 24. Now the conductor C illustrated in FIG. 6 is not the same as the conductor illustrated in FIG. 5 but is instead associated with a different one of the via tabs. Again, refer to FIG. 2 for an illustration of the various via tabs 36.

Figure 7:
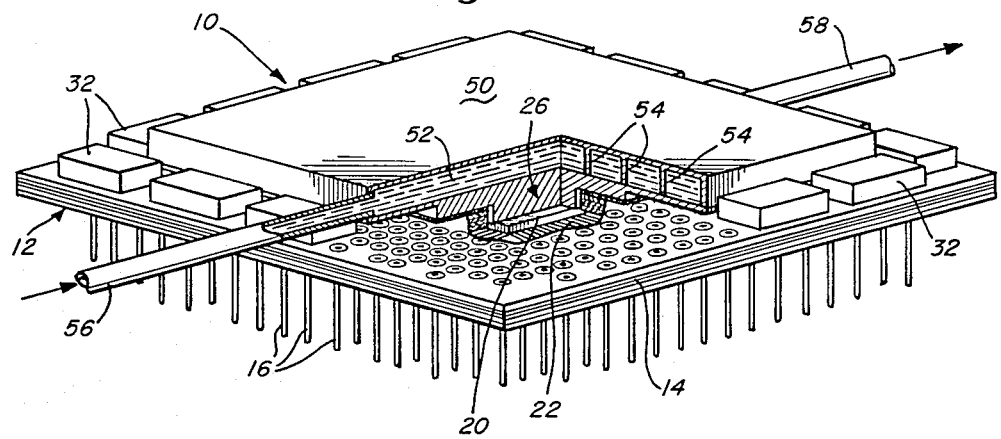
FIG. 7 is a perspective view similar to that illustrated in FIG. 1 for a heat sink that is of the liquid cooled type.

Reference is now made to FIG. 7 which is a perspective view partially cut away illustrating an alternate embodiment of the present invention in which the heat sink employs liquid cooling. Other than the heat sink construction, the embodiment of FIG. 7 is substantially the same as that described previously in FIGS. 1 ∝ 3. In FIG. 7 the semiconductor chip 20 is shown secured, such as by the use of an epoxy to the support button 26. Integral with the metallic support button 26 is the heat sink 50. The heat sink is in the form of a chamber for containing a liquid 52. The liquid 52 may be a cooling liquid such as water but preferably is a coolant liquid. The chamber of the heat sink has baffles 54 as illustraed in FIG. 7 for separating the heat sink into separate individual chambers. FIG. 7 also illustrates an inlet 56 and outlet 58. Some type of a pump would be connected between the inlet and outlet for forcing the liquid 52 through the heat sink chamber for the purpose of conveying heated fluid and recirculating cooled fluid to the heat sink.

Figure 8:
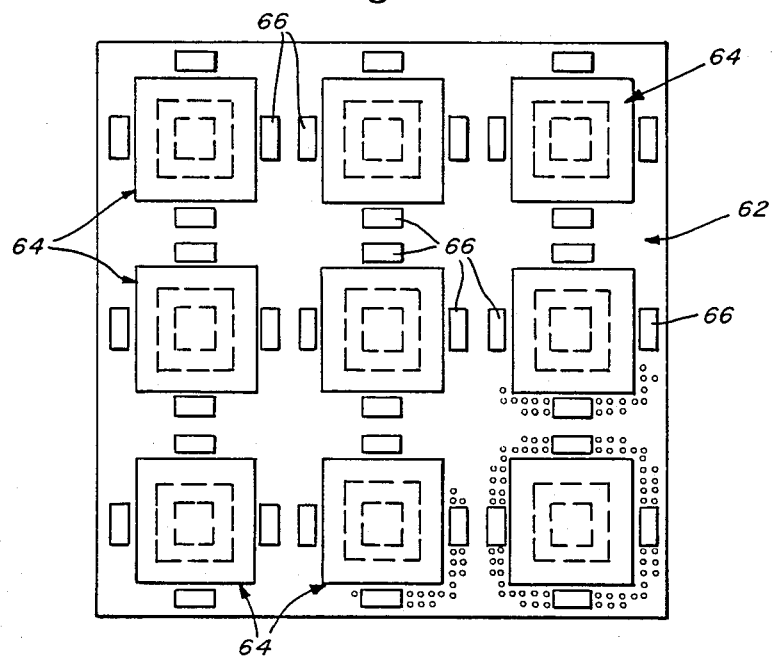
FIG. 8 illustrates an alternate embodiment of the present invention in the form of a module having multiple chip support pads.
Figure 9:
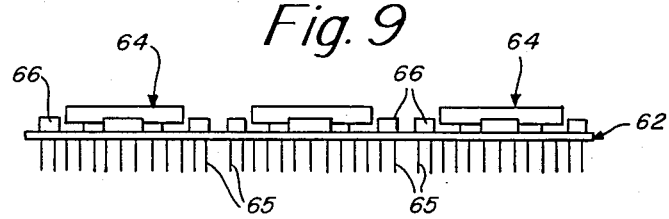
FIG. 9 is a side elevation view of the module of FIG. 8.

FIGS. 8 and 9 illustrate still another embodiment of the present invention in which the semiconductor chips are supported in a module form including a circuit board 62 having a plurality of holes disposed in an array for receiving the semiconductor chip support button and heat sink, as illustrated in FIGS. 8 and 9 at 64. FIG. 9 illustrates the pins 65 at the bottom of the circuit board. The drawing of FIGS. 8 and 9 also illustrate the decoupling capacitors 66 disposed peripherally about each of the members 64. The internal construction of the embodiment of FIGS. 8 and 9 can be substantially the same as that described previously in connection with FIGS. 1–3.

Figure 10:
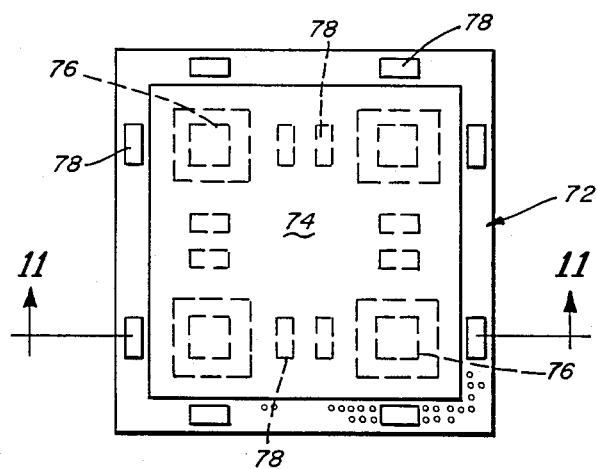
FIG. 10 illustrates still a further embodiment of the present invention employing a single common heat sink plate with multiple chip pads for providing more uniform semiconductor chip temperatures.
Figure 11:
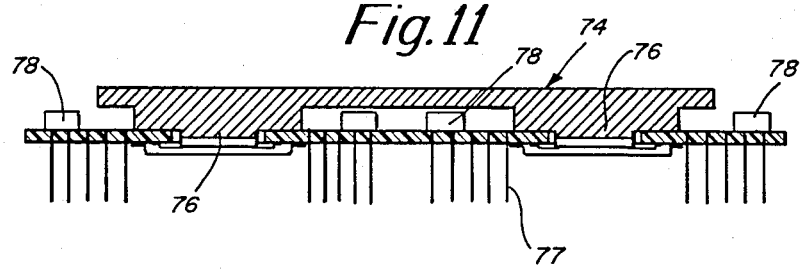
FIG. 11 is a cross sectional view taken along line 11-11 of FIG. 10.

Reference is now made to FIGS. 10 and 11 for still a further embodiment of the present invention. This embodiment illustrates a circuit board 72 that also is provided with several openings for receiving semiconductor circuit chips. In this embodiment there is provided a single piece heat sink plate 74 having integral therewith multiple chip pads 76. This particular heat sink and pad construction provides for more uniform heat sink temperatures from semiconductor chip to semiconductor chip. It is noted that in FIGS. 10 and 11 there is also described the pins 77 and the decoupling capacitors 78. The specific details of the circuit board layers and other details of the module of FIGS. 10 and 11 are substantially the same as described in connection with FIGS. 1–3.

In a summary of the preferred embodiment of FIGS. 1–3, the layers L1 and L3 are Vcc planes (ground) and form a strip line construction relative to the signal layer L2. The geometries are chosen to provide the desired characteristic impedance. Layer L1 functions as a reference plane only while layer L3 in addition to serving as a reference plane also is the current path to the inner vias (plate-through holes) which then connect to the tabs 24. The layers L4 and L5 are also planes and serve as current paths to the power tabs.

With the design of the present invention there is a lower DC resistance and a significantly lower inductance which permits a reduction of power and ground pins from say 50 to 32. Even with the pin count being reduced, resistance and inductance is significantly improved.

As indicated previously, the power and ground pins are assigned to the outer perimeter of the package which permits all 256 signal lines to be on one layer and permits more uniform characteristics (i.e., capacitance, inductance resistance, time delay). Also, extending the Vee and Vee 2 planes to the outer edge of the package provides, in addition to good power distribution, an optimum position to place the decoupling capacitors on the top of the package thus avoiding most of the pin inductance. Furthermore, because the pins are spaced further apart mutual inductance is reduced.

With respect to the heat sink arrangement there have been basically two heat sinks described herein. One an integral heat sink preferably of solid metal material with a transfer surface and the other a liquid cooled heat sink. The integral assembly may either be a homogenious material or a laminate such as one of copper, tungsten and aluminum.

One of the key advantages to the construction of the present invention is the integral nature of the heat sink. This avoids having to use after package completion, thermal grease, epoxies or mechanical clips in the final assembly.

In accordance with the invention there is described herein a multi-chip module configuration. In the embodiment described there is illustrated a pin module although other connection methods may be employed, such as surface mount tabs, flex print, or pressure connections. In addition, individual heat sinks may be combined into a single plate construction as illustrated in the last embodiment described so as to provide more uniform semiconductor chip temperatures.

Having now described a limited number of embodiments of the present invention, it should now be apparent to those skilled in the art that numerous other embodiments and modifications thereof are contemplated as falling with the scope of the present invention as defined by the appended claims. For example, in connection with the primary embodiments described herein, the concepts have been explained in connection with a pin grid array. However, it is understood that the features of the invention may also apply to a surface mount device. For a surface mount device rather than using pins, flexible leads are employed.

What is claimed is:

1. A semiconductor chip carrier package comprising:
multi-layer circuit board means having an outer peripheral portion defining a substantially central aperture therethrough and having upper and lower surfaces;
semiconductor chip support means including a chip support button portion extending into said aperture and having a chip support surface disposed substantially adjacent the lower surface of said multi-layer circuit board means and of a smaller cross-dimension that said aperture, and a heat sink portion of larger cross-dimension that said aperture overlaying and affixed to at least a portion of the upper surface of said multi-layer circuit board means; said chip support surface having a chip mounted thereon;

said multi-layer circuit board means comprising separate dielectric boards defining multiple conductive run layers, including at least one signal layer and at least one power layer;

a plurality of pins supported by said outer peripheral portion of and extending outwardly from the lower surface of said multi-layer circuit board means, said plurality of pins including signal pins coupled to at least one of said signal layers and power pins coupled to at least one of said power layers;

said power pins being disposed adjacent the outer periphery of said peripheral portion at locations more remote from said aperture than said signal pins; and, means conductively connecting leads of said semiconductor chip to corresponding conductive runs of said signal and power layers.

2. The semiconductor chip carrier package of claim 1, wherein said button portion and said heat sink portion are integrally formed of a heat-conductive material.

3. The semiconductor chip carrier package of claim 2, wherein said heat sink portion includes a thermal transfer surface and a peripheral cantilever section.

4. The semiconductor chip carrier package of claim 2, including:
at least one decoupling capacitor supported on the upper surface of said multi-layer circuit board means adjacent said cantilever section of said heat sink portion of said chip support means; and
means connecting said at least one capacitor to predetermined pins.

5. A semiconductor chip carrier package as set forth in claim 1, wherein the number of power layers present in said multi-layer circuit board means corresponds to the number of different power leads on said semiconductor chip.

6. A semiconductor chip carrier package as set forth in claim 5, wherein said means conductively connecting said leads of said semiconductor chip to corresponding conductive runs of said signal and power layers include tabs to which said chip leads are secured.

7. A semiconductor chip carrier package as set forth in claim 6, wherein said tabs are located on at least one signal layer of said multi-layer circuit board means.

8. A semiconductor chip carrier package as set forth in claim 7, wherein conductive vias intercouple at least one of said power layer conductive runs to selected tabs.

9. A semiconductor chip carrier package as set forth in claim 1, including a lid and associated lid seal mounted on said lower surface of said multi-layer circuit board means for covering said semiconductor chip.

10. A semiconductor chip carrier package as set forth in claim 1, wherein said heat sink portion of said chip support means includes a chamber adapted for the flow of a cooling fluid therethrough.

11. A semiconductor chip carrier package as set forth in claim 1, wherein said multi-layer circuit boards means defines an array of spaced apertures, and wherein a semiconductor chip is supported adjacent the lower side of said multi-layer circuit board in each of said apertures by chip support means.

12. A semiconductor chip carrier package as set forth in claim 1, wherein said multi-layer circuit board means defines an array of spaced apertures; and,
wherein said chip support means comprises a heat sink portion of larger cross-dimension than said array of apertures having a lower surface overlaying said array and affixed to at least a portion of the upper surface of said multi-layer circuit board means, and a number of chip support buttons corresponding to the number of apertures in said multi-layer circuit board means, said buttons extending from the lower surface of said heat sink portion into said apertures.

13. A semiconductor chip carrier package comprising: multi-layer circuit board means having an outer peripheral portion defining a substantially central aperture therethrough and having upper and lower surfaces;
semiconductor chip support means including a chip support button portion extending into said aperture and having a chip support surface disposed substantially adjacent the lower surface of said multi-layer circuit board means and of a small cross-dimension that said aperture, and a heat sink portion of larger cross-dimension than said aperture overlaying and affixed to at least a portion of the upper surface of said multi-layer circuit board means;

said chip support surface having a chip mounted thereon;

said multi-layer circuit board means comprising separate dielectric boards defining multiple conductive run layers including at least one signal layer and at least one power layer;

a plurality of conductor members supported by said outer peripheral portion of said multi-layer circuit board means and extending outwardly from the lower surface of said multi-layer circuit board means, said plurality of conductor members including signal conductor members coupled to at least one of said signal layers and power conductive members coupled to at least one of said power layers;

said power conductive members being disposed adjacent to the outer periphery of said peripheral portion at locations more remote from said aperture than said signal conductive members; and means conductively connecting leads of said semiconductor chip to corresponding conductive runs of said signal and power layers.

* * * * *